United States Patent
Parthasarathy et al.

(10) Patent No.: US 12,477,836 B2
(45) Date of Patent: Nov. 18, 2025

(54) LOW CAPACITANCE SILICON CONTROLLED RECTIFIER TOPOLOGY FOR OVERVOLTAGE PROTECTION

(71) Applicant: Analog Devices, Inc., Wilmington, MA (US)

(72) Inventors: Srivatsan Parthasarathy, Acton, MA (US); Javier A. Salcedo, Chelmsford, MA (US); Jean-Jacques Hajjar, Lexington, MA (US); Yuanzhong Zhou, Andover, MA (US); Tom Pilling, San Diego, CA (US)

(73) Assignee: Analog Devices, Inc., Wilmington, MA (US)

( * ) Notice: Subject to any disclaimer, the term of this patent is extended or adjusted under 35 U.S.C. 154(b) by 48 days.

(21) Appl. No.: 18/533,942

(22) Filed: Dec. 8, 2023

(65) Prior Publication Data

US 2025/0194260 A1  Jun. 12, 2025

(51) Int. Cl.
*H10D 89/60* (2025.01)
*H02H 9/04* (2006.01)

(52) U.S. Cl.
CPC .......... *H10D 89/713* (2025.01); *H02H 9/046* (2013.01); *H10D 89/611* (2025.01); *H10D 89/811* (2025.01); *H10D 89/911* (2025.01)

(58) Field of Classification Search
CPC .. H10D 89/713; H10D 89/611; H10D 89/811; H10D 89/911; H10D 8/00;
(Continued)

(56) References Cited

U.S. PATENT DOCUMENTS 5,541,801 A * 7/1996 Lee ....................... H10D 89/713
361/111
5,610,790 A  3/1997 Staab et al.
(Continued)

FOREIGN PATENT DOCUMENTS

CN   109166850 A   1/2019
CN   112397505 A   2/2021
(Continued)

OTHER PUBLICATIONS

Parthasarathy et al., "Device for Protecting High Frequency and High Data Rate Interface Applications in FinFET Process Technologies", 2022 IEEE Radio Frequency Integrated Circuits Symposium, IEEE Jun. 19, 2022, pp. 203-206.
(Continued)

*Primary Examiner* — Dharti H Patel
(74) *Attorney, Agent, or Firm* — Knobbe, Martens, Olson & Bear, LLP

(57) ABSTRACT

Low capacitance silicon controlled rectifier (SCR) topologies for overvoltage protection are disclosed herein. In certain embodiments, an overvoltage protection circuit is connected between an RF signal pad and a ground signal pad. The overvoltage protection circuit includes a fin field-effect transistor (FinFET) SCR including a PNP bipolar transistor and an NPN bipolar transistor that are cross-coupled, a FinFET trigger circuit connected between an emitter of the PNP bipolar transistor and a base of the NPN bipolar transistor, and a linearity enhancement impedance connected between a reference voltage terminal and the emitter of the PNP bipolar transistor. In certain implementations, a FinFET diode is further included in series with the FinFET SCR with a cathode of the FinFET diode connected to the emitter of the PNP bipolar transistor.

20 Claims, 10 Drawing Sheets

(58) Field of Classification Search
CPC .... H10D 18/251; H10D 30/62; H10D 62/117; H10D 62/142; H10D 62/148; H02H 9/046
USPC .......................................................... 361/56
See application file for complete search history.

(56) References Cited

U.S. PATENT DOCUMENTS

| | | | |
|---|---|---|---|
| 5,675,469 A * | 10/1997 | Racino | H10D 89/713 361/111 |
| 6,768,616 B2 | 7/2004 | Mergens et al. | |
| 7,285,828 B2 | 10/2007 | Salcedo et al. | |
| 7,566,914 B2 | 7/2009 | Salcedo et al. | |
| 7,601,991 B2 | 10/2009 | Salcedo et al. | |
| 8,044,457 B2 | 10/2011 | Salcedo et al. | |
| 8,222,698 B2 | 7/2012 | Salcedo et al. | |
| 8,320,091 B2 | 11/2012 | Salcedo et al. | |
| 8,368,116 B2 | 2/2013 | Salcedo et al. | |
| 8,373,956 B2 * | 2/2013 | Abou-Khalil | H02H 9/046 361/118 |
| 8,416,543 B2 | 4/2013 | Salcedo | |
| 8,422,187 B2 | 4/2013 | Parthasarathy et al. | |
| 8,432,651 B2 | 4/2013 | Salcedo et al. | |
| 8,466,489 B2 | 6/2013 | Salcedo et al. | |
| 8,553,380 B2 | 10/2013 | Salcedo | |
| 8,564,065 B2 | 10/2013 | Donovan et al. | |
| 8,570,698 B2 | 10/2013 | Lee et al. | |
| 8,592,860 B2 | 11/2013 | Salcedo et al. | |
| 8,598,641 B2 | 12/2013 | Chen et al. | |
| 8,610,251 B1 | 12/2013 | Salcedo | |
| 8,637,899 B2 | 1/2014 | Salcedo | |
| 8,665,571 B2 | 3/2014 | Salcedo et al. | |
| 8,680,620 B2 | 3/2014 | Salcedo et al. | |
| 8,779,518 B2 | 7/2014 | Lin et al. | |
| 8,796,729 B2 | 8/2014 | Clarke et al. | |
| 8,860,080 B2 | 10/2014 | Salcedo | |
| 8,946,822 B2 | 2/2015 | Salcedo et al. | |
| 8,947,841 B2 | 2/2015 | Salcedo et al. | |
| 8,958,187 B2 | 2/2015 | Parthasarathy et al. | |
| 9,006,781 B2 | 4/2015 | Salcedo et al. | |
| 9,088,256 B2 | 7/2015 | Cosgrave et al. | |
| 9,123,540 B2 | 9/2015 | Salcedo et al. | |
| 9,147,677 B2 | 9/2015 | Salcedo et al. | |
| 9,171,832 B2 | 10/2015 | Salcedo et al. | |
| 9,275,991 B2 | 3/2016 | Salcedo et al. | |
| 9,293,912 B2 | 3/2016 | Parthasarathy et al. | |
| 9,318,479 B2 | 4/2016 | Li et al. | |
| 9,478,608 B2 | 10/2016 | Salcedo et al. | |
| 9,634,482 B2 | 4/2017 | Parthasarathy et al. | |
| 9,653,448 B2 | 5/2017 | Zhang et al. | |
| 9,831,233 B2 | 11/2017 | Salcedo et al. | |
| 9,876,005 B2 | 1/2018 | Su et al. | |
| 10,008,491 B1 | 6/2018 | Li et al. | |
| 10,083,952 B2 | 9/2018 | Lee et al. | |
| 10,158,029 B2 | 12/2018 | Parthasarathy et al. | |
| 10,177,566 B2 | 1/2019 | Zhao et al. | |
| 10,199,369 B2 | 2/2019 | Parthasarathy et al. | |
| 10,249,609 B2 | 4/2019 | Salcedo et al. | |
| 10,340,370 B2 | 7/2019 | Wang et al. | |
| 10,504,886 B1 | 12/2019 | Yam et al. | |
| 11,004,849 B2 | 5/2021 | Salcedo et al. | |
| 11,302,689 B1 * | 4/2022 | Yam | H10D 89/814 |
| 11,595,036 B2 | 2/2023 | Salcedo et al. | |
| 11,942,473 B2 * | 3/2024 | Luo | H10D 89/711 |
| 12,261,593 B2 | 3/2025 | Salcedo et al. | |
| 2002/0089017 A1 | 7/2002 | Lai et al. | |
| 2004/0164356 A1 | 8/2004 | Josef Mergens et al. | |
| 2004/0201033 A1 | 10/2004 | Russ et al. | |
| 2005/0200396 A1 | 9/2005 | Hsu et al. | |
| 2008/0088994 A1 * | 4/2008 | Lai | H10D 89/713 361/56 |
| 2012/0275073 A1 * | 11/2012 | Tsai | H02H 9/046 361/56 |
| 2013/0128399 A1 * | 5/2013 | Davis | H10D 89/713 361/56 |
| 2014/0097465 A1 | 4/2014 | Shrivastava et al. | |
| 2014/0167105 A1 | 6/2014 | Salcedo et al. | |
| 2014/0268438 A1 | 9/2014 | Davis et al. | |
| 2015/0008476 A1 | 1/2015 | Shrivastava et al. | |
| 2015/0029622 A1 | 1/2015 | Su et al. | |
| 2015/0124360 A1 * | 5/2015 | Jack | H10D 18/251 361/679.21 |
| 2016/0056146 A1 | 2/2016 | Li et al. | |
| 2016/0056147 A1 | 2/2016 | Li et al. | |
| 2016/0141358 A1 | 5/2016 | Salcedo et al. | |
| 2016/0204096 A1 | 7/2016 | Zhao et al. | |
| 2016/0261110 A1 | 9/2016 | Ivanov et al. | |
| 2016/0285255 A1 | 9/2016 | O'Donnell et al. | |
| 2016/0300830 A1 | 10/2016 | Salcedo et al. | |
| 2016/0336740 A1 | 11/2016 | Parthasarathy et al. | |
| 2016/0336744 A1 | 11/2016 | Parthasarathy et al. | |
| 2017/0069616 A1 | 3/2017 | Cai et al. | |
| 2017/0125399 A1 | 5/2017 | Huang et al. | |
| 2017/0256534 A1 | 9/2017 | Parthasarathy et al. | |
| 2017/0317070 A1 | 11/2017 | Salcedo et al. | |
| 2018/0026440 A1 | 1/2018 | Zhao et al. | |
| 2018/0068996 A1 | 3/2018 | Lee | |
| 2018/0158814 A1 | 6/2018 | Salcedo et al. | |
| 2018/0158935 A1 | 6/2018 | Wang et al. | |
| 2018/0211951 A1 | 7/2018 | Luo et al. | |
| 2018/0226788 A1 | 8/2018 | Salcedo et al. | |
| 2018/0308846 A1 | 10/2018 | Huang et al. | |
| 2019/0013310 A1 | 1/2019 | Paul et al. | |
| 2019/0027470 A1 | 1/2019 | Han et al. | |
| 2019/0131787 A1 * | 5/2019 | He | H10D 89/713 |
| 2020/0111778 A1 | 4/2020 | Lai et al. | |
| 2020/0286889 A1 | 9/2020 | Salcedo et al. | |
| 2020/0403007 A1 | 12/2020 | Thomson et al. | |
| 2021/0344336 A1 | 11/2021 | Salcedo et al. | |
| 2023/0163757 A1 | 5/2023 | Salcedo et al. | |
| 2024/0363618 A1 * | 10/2024 | Parthasarathy | H10D 89/713 |
| 2025/0202471 A1 * | 6/2025 | Salcedo | H10D 18/251 |

FOREIGN PATENT DOCUMENTS

| | | | | |
|---|---|---|---|---|
| CN | 113921516 A | * | 1/2022 | ............ H10D 89/713 |
| KR | 100968647 B1 | * | 7/2010 | ............ H10D 89/713 |
| WO | WO-2017052553 A1 | * | 3/2017 | ............. H01L 23/60 |
| WO | WO-2017078676 A1 | * | 5/2017 | ........... H10D 18/251 |

OTHER PUBLICATIONS

Karp et al., "FinFET MPSoC 32 GB/s transceivers: Custom ESD protection and verification." 2016 IEEE 59th International Midwest Symposium on Circuits and Systems (MWSCAS). IEEE, 2016, in 4 pages.

Extended European Search Report received in Application No. 24213905.3 dated May 21, 2025 in 11 pages.

* cited by examiner

LOW CAPACITANCE SILICON CONTROLLED RECTIFIER TOPOLOGY FOR OVERVOLTAGE PROTECTION

FIELD OF THE DISCLOSURE

Embodiments of the invention relate to electronic systems, and more particularly to, electrical overvoltage protection for radio frequency signal interfaces.

BACKGROUND

Electronic systems can be exposed to electrical overstress events, or electrical signals of short duration having rapidly changing voltage and high power. Such electrical overstress events can occur during manufacturing, assembly, and/or end-user application environment. Electrical overstress events include, for example, electrical overstress (EOS), electromagnetic interference (EMI), and electrostatic discharge (ESD) arising from the abrupt release of charge from an object or person to an electronic system. The design constraints to safely handle these type of environmental overstress conditions are particularly complex in fin field-effect-transistor (FinFET) systems-on-a-chip (SoC) for high frequency applications.

Electrical overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

Low capacitance silicon controlled rectifier (SCR) topologies for overvoltage protection are disclosed herein. In certain embodiments, an overvoltage protection circuit is connected between an RF signal pad and a ground signal pad. The overvoltage protection circuit includes a FinFET SCR including a PNP bipolar transistor and an NPN bipolar transistor that are cross-coupled, a FinFET trigger circuit connected between an emitter of the PNP bipolar transistor and a base of the NPN bipolar transistor, and a linearity enhancement impedance connected between a reference voltage terminal and the emitter of the PNP bipolar transistor. In certain implementations, a FinFET diode is further included in series with the FinFET SCR with a cathode of the FinFET diode connected to the emitter of the PNP bipolar transistor. By including the linearity enhancement impedance, RF signals are impeded or inhibited (for example, blocked) from reaching the reference voltage terminal. Thus, the linearity of the overvoltage protection circuit is improved. Further, the linearity enhancement impedance aids in biasing the emitter of the PNP bipolar transistor with a reference voltage for low capacitance operation. Accordingly, the resulting protection structure is both linear and low capacitance. Further, by including the FinFET trigger circuit, high speed activation with low trigger voltage is achieved.

In one aspect, an integrated circuit (IC) includes a radio frequency (RF) signal pad, a ground pad, and an overvoltage protection circuit connected between the RF signal pad and the ground pad and configured to activate in response to an electrical overvoltage condition received between the RF signal pad and the ground pad. The overvoltage protection circuit comprises a first fin field-effect transistor (FinFET) silicon controlled rectifier (SCR) including a first PNP bipolar transistor and a first NPN bipolar transistor, wherein a collector of first NPN bipolar transistor is connected to a base of the first PNP bipolar transistor, and a base of the first NPN bipolar transistor is connected to a collector of the first PNP bipolar transistor, a fin field-effect transistor (FinFET) trigger circuit connected between an emitter of the first PNP bipolar transistor and the base of the first NPN bipolar transistor, and a linearity enhancement impedance connected between a reference voltage terminal and the emitter of the first PNP bipolar transistor, the linearity enhancement impedance configured to inhibit coupling of a RF signal from the RF signal pad to the reference voltage terminal.

In another aspect, an overvoltage protection circuit for protecting a radio frequency (RF) signal pad and a ground pad of an integrated circuit (IC) is provided. The overvoltage protection circuit includes a first fin field-effect transistor (FinFET) silicon controlled rectifier (SCR) including a first PNP bipolar transistor and a first NPN bipolar transistor, wherein a collector of first NPN bipolar transistor is connected to a base of the first PNP bipolar transistor, and a base of the first NPN bipolar transistor is connected to a collector of the first PNP bipolar transistor, a fin field-effect transistor (FinFET) trigger circuit connected between an emitter of the first PNP bipolar transistor and the base of the first NPN bipolar transistor, and a linearity enhancement impedance connected between a reference voltage terminal and the emitter of the first PNP bipolar transistor, the linearity enhancement impedance configured to inhibit coupling of a RF signal from the RF signal pad to the reference voltage terminal.

In another aspect, a method of protecting an integrated circuit (IC) from electrical overstress is provided. The method includes receiving an electrical overvoltage condition between a radio frequency (RF) signal pad and a ground pad, conducting a trigger current in response to the electrical overvoltage condition using a fin field-effect transistor (FinFET) trigger circuit that is connected between an emitter of a first PNP bipolar transistor and a base of a first NPN bipolar transistor, activating the FinFET SCR in response to the trigger current, wherein the FinFET SCR includes the first PNP bipolar transistor and the first NPN bipolar transistor, wherein a collector of first NPN bipolar transistor is connected to a base of the first PNP bipolar transistor, and a base of the first NPN bipolar transistor is connected to a collector of the first PNP bipolar transistor, and inhibiting coupling of a RF signal from the RF signal pad using a linearity enhancement impedance connected between a reference voltage terminal and the emitter of the first PNP bipolar transistor.

DETAILED DESCRIPTION

Figure 1A:
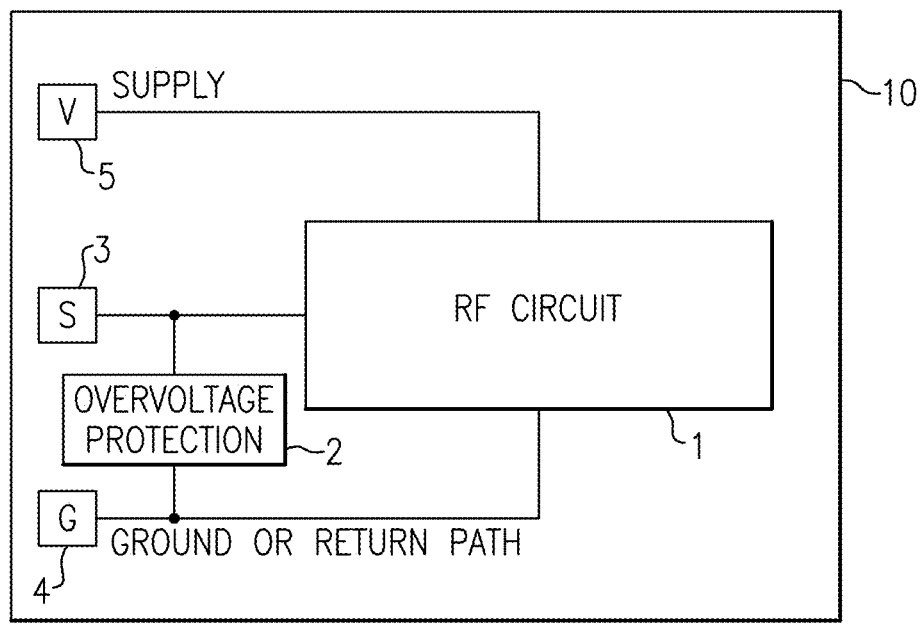
FIG. 1A is a schematic diagram of one embodiment of an integrated circuit (IC) including a silicon controlled rectifier-based (SCR-based) overvoltage protection circuit.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include overvoltage protection circuits to protect circuits and/or components from electrical overstress events. To help guarantee that an electronic system is reliable, manufacturers test such electronic systems under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of electrical overstress events, including electrical overstress (EOS) and/or electrostatic discharge (ESD).

A number of design challenges are present for protecting radio frequency (RF) circuits from electrical overstress events, particularly when such RF circuits are fabricated using FinFET processes. For example, the performance of RF circuits is degraded by capacitive loading and/or non-linearity arising from the presence of electrical overvoltage protection structures along RF signal paths. Furthermore, FinFET gate structures are easily damaged in response to electrical overstress conditions, thus rendering RF circuits fabricated with a FinFET process particularly susceptible to damage.

Conventional diode-based RF input-output (IO) protection poses significant limitations in achieving RF performance for advancing 5G communication requirements while preserving interface robustness.

For example, diode-based protection structures can suffer from slow reaction time and/or large voltage overshoot when subjected to fast ESD transients. Such large voltage overshoots can damage thin oxides being protected in advanced nm process nodes, such as complementary metal oxide semiconductor (CMOS) FinFET technologies of 16 nm or less.

Additionally, diode-based protection structures can have high trigger voltage that allows for large voltage build-up before activation. Moreover, diode-based protection structures can suffer from high capacitance and/or non-linearity that can degrade RF performance during normal operation when electrical overstress events are not present.

Low capacitance silicon controlled rectifier (SCR) topologies for overvoltage protection are disclosed herein. In certain embodiments, an overvoltage protection circuit is connected between an RF signal pad and a ground signal pad. The overvoltage protection circuit includes a FinFET SCR including a PNP bipolar transistor and an NPN bipolar transistor that are cross-coupled, a FinFET trigger circuit connected between an emitter of the PNP bipolar transistor and a base of the NPN bipolar transistor, and a linearity enhancement impedance connected between a reference voltage terminal and the emitter of the PNP bipolar transistor. In certain implementations, a FinFET diode is further included in series with the FinFET SCR with a cathode of the FinFET diode connected to the emitter of the PNP bipolar transistor.

By including the linearity enhancement impedance, RF signals are impeded (for example, blocked) from reaching the reference voltage terminal. Thus, the linearity of the overvoltage protection circuit is improved. Further, the linearity enhancement impedance aids in biasing the emitter of the PNP bipolar transistor with a reference voltage for low capacitance operation. Accordingly, the resulting protection structure is both linear and low capacitance. Further, by including the FinFET trigger circuit, high speed activation with low trigger voltage is achieved.

The SCR-based protection structure can be fabricated in a variety of advanced technologies, including CMOS FinFET process nodes of 16 nm or less.

The anode terminal and the cathode terminal of the SCR-based protection structure can be connected to provide protection to an RF circuit, which can be fabricated with the SCR-based protection structure on a common integrated circuit (IC). In certain implementations, the anode terminal connects to the RF signal pad of the IC while the cathode terminal connects to the ground signal pad of the IC. Thus, the SCR-based protection structure can be ground-referenced and used to protect an RF circuit formed on a common IC.

Furthermore, in certain implementations, an additional instantiation of the SCR-based protection structure is included with the anode terminal connected to the ground signal pad and the cathode connected to the RF signal pad. By including a pair of SCR-based protection structures connected in this manner, both forward and reverse overvoltage protection can be achieved.

In one example, the SCR-based protection structure protects an RF signal pad or port operating with asymmetrical signal swings in the range of +5.0V/−5.0V and having an operating frequency of about 20 GHz or higher. However, the SCR-based overvoltage protection circuits herein can be deployed in other configurations and operating scenarios.

The n-well (NW) and p-well (PW) of the SCR-based protection structure can be isolated from the substrate (for example, a p-type substrate or PSUB) by deep n-type well (DNW). In certain implementations, rather than directly connected the DNW to a power supply voltage (for example, a highest available supply voltage with the aim of preventing parasitic diodes between the PW and DNW and/or between the substrate and DNW from becoming forward biased), a resistor or other biasing circuit is included between the power supply voltage and DNW.

By connecting the DNW in this manner, linearity performance is improved by blocking a potential path between the anode terminal and the power supply voltage for RF signals. Furthermore, connecting the DNW in this manner allows biasing of the DNW to a desired electrical potential to achieve low capacitance. Accordingly, biasing the DNW in this manner can achieve both improved linearity and reduced capacitance relatively to an implementation in which the DNW is directly connected to the highest available supply voltage.

The SCR-based protection structure includes a PNP bipolar transistor and an NPN bipolar transistor that are cross-coupled. For example, the P+ fin regions, the NW, and the PW form the emitter, base, and collector, respectively, of the PNP bipolar transistor, while the N+ fin regions, the PW, and the NW form the emitter, base, and collector, respectively, of the NPN bipolar transistor. Additionally, the collector of the NPN bipolar transistor is connected to the base of the PNP bipolar transistor, while the collector of the PNP bipolar transistor is connected to the base of the NPN bipolar transistor.

Inclusion of the FinFET trigger circuit serves to further reduce the trigger voltage of the FinFET SCR by providing a displacement current to the base of the NPN bipolar transistor in response to an electrical overstress event. A tuning circuit (for example, a tuning resistor or other tuning element) can be included at the base of the NPN bipolar transistor to provide fine-tuned control over turn-on characteristics of the FinFET SCR. The trigger circuit can also serve to reduce DC leakage current of the FinFET SCR by biasing the base of the NPN bipolar transistor.

The SCR-based protection structures disclosed herein serve to robustly protect RF circuits and/or other core devices with high speed, high voltage tolerance, high linearity, and/or low capacitance. The SCR-based protection structures herein can achieve high linearity performance for communication systems specified to operate with RF power performance of up to 20 dBM or more.

The SCR-based protection structures provide protection against electrical overstress events, which can include ESD events. Additionally, the SCR-based protection structures provide robust protection from overstress conditions with little to no degradation to RF performance parameters such as second-order harmonic distortion (HD2), third-order harmonic distortion (HD3), third-order intermodulation distortion (IMD3), and/or third-order intercept point (IP3). Furthermore, the SCR-based protection structures behave linearly with respect to capacitance and current characteristics such that presence of the protection device provides little to no interference with operation of the RF signal interface.

The teachings herein are applicable to SCR-based protection structures that protect RF signal pads handling RF signals of a wide range of frequencies, including not only RF signals between 100 MHz and 7 GHz, but also to higher frequencies, such as those in the X band (about 7 GHz to 12 GHZ), the $K_u$ band (about 12 GHz to 18 GHZ), the K band (about 18 GHz to 27 GHZ), the $K_a$ band (about 27 GHz to 40 GHZ), the V band (about 40 GHz to 75 GHz), and/or the W band (about 75 GHz to 110 GHZ). Accordingly, the teachings herein are applicable to protecting a wide variety of RF circuits, including microwave circuits.

Furthermore, the RF circuits protected by the SCR-based protection structures herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

FIG. 1A is a schematic diagram of one embodiment of an IC 10. The IC 10 includes an RF circuit 1, an SCR-based overvoltage protection circuit 2, an RF signal(S) pad 3, a ground (G) pad 4, and a power supply voltage (V) pad 5. An IC is also referred to herein as a semiconductor die or chip. Although certain circuits and pins of the IC 10 are shown in FIG. 1A, the IC 10 can be adapted to include additional pins and/or circuitry. Such details are omitted from FIG. 1A for clarity of the figure.

In the illustrated embodiment, the SCR-based overvoltage protection circuit 2 is integrated with the RF circuit 1 on a common chip. The RF circuit 1 can include one or more of wide range of high frequency circuits for handling RF signals including, but not limited to, RF amplifiers, RF mixers, RF attenuators, RF filters, RF data converters, and/or other circuitry. Although shown as protecting an RF circuit, the SCR-based protection circuits herein can also be used to protect other types of circuits and/or components.

The RF circuit 1 is connected to the RF signal pad 3, which can correspond to an input signal pad, an output signal pad, or a bidirectional signal pad. The RF circuit 1 also receives a ground voltage from the ground pad 4 and a power supply voltage from the power supply voltage pad 5.

In the illustrated embodiment, the SCR-based overvoltage protection circuit 2 includes an anode connected to the RF signal pad 3 and a cathode connected to the ground pad 4. The SCR-based overvoltage protection circuit 2 is normally in a high impedance or off state, but transitions to a low impedance or on state in response to an electrical overstress event received between the RF signal path 3 and the ground pad 4. Thus, the SCR-based overvoltage protection circuit 2 serves as a ground-referenced protection structure for providing protection against ESD and/or other electrical overstress events received on the RF signal pad 3.

A traditional ground-referenced diode-based ESD protection circuit causes high distortion due to stacking of multiple diodes to allow for large RF power handling. However, stacking multiple diodes leads to elevated distortion due to non-linearity and/or higher on-state resistance that degrades ESD performance.

In comparison, the SCR-based overvoltage protection circuit 2 of FIG. 1A can be implemented with one or more features of the present disclosure to achieve low trigger voltage, low capacitance, high power handling capability, and/or high linearity.

Although FIG. 1A illustrates one example application for SCR-based protection structures, the teachings herein are applicable to a wide variety of high-speed interfaces.

Figure 1B:
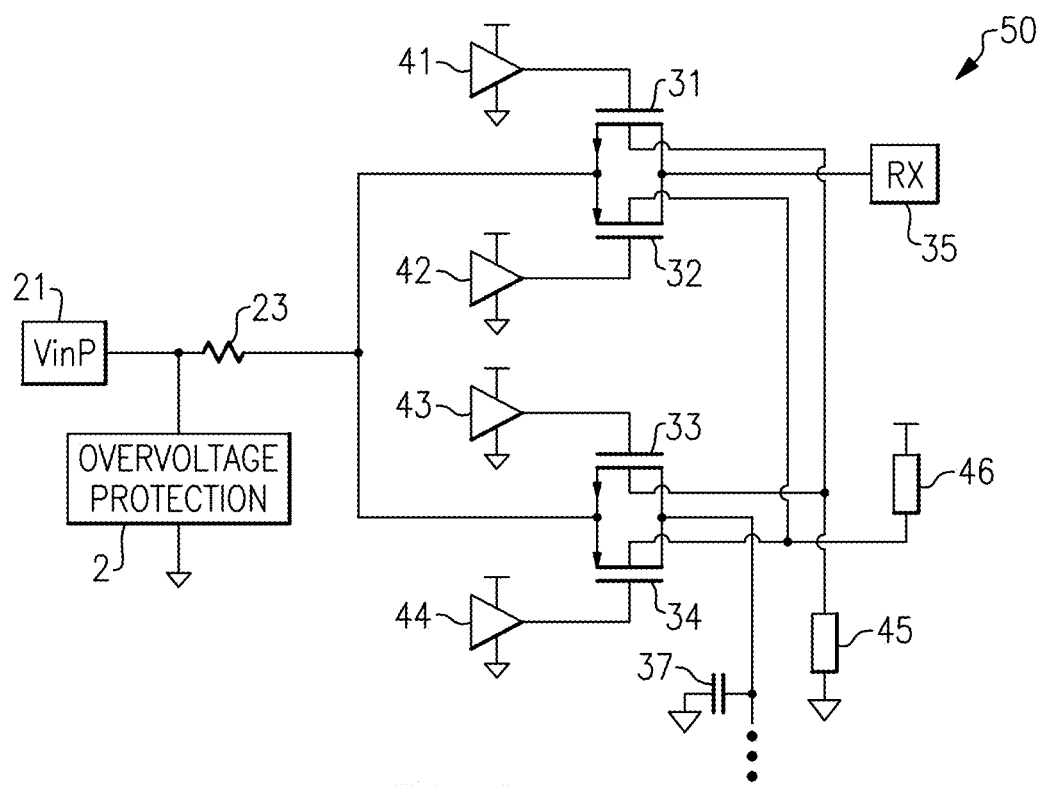
FIG. 1B is a schematic diagram of another embodiment of an IC including an SCR-based overvoltage protection circuit.

FIG. 1B is a schematic diagram of another embodiment of an IC 50. The IC 50 includes an RF signal pad 21, an SCR-based overvoltage protection circuit 2, an input resistor 23, a first n-type field-effect transistor (NFET) 31, a first p-type field-effect transistor (PFET) 32, a second NFET 33, a second PFET 34, an RF receive circuit 35, a capacitor 37, a first driver 41, a second driver 42, a third driver 43, a fourth driver 44, a p-well (PW) biasing circuit 45 and an n-well biasing circuit 46.

The IC 50 illustrates another example application for the SCR-based protection structures disclosed herein. Although FIG. 1B illustrates another example application for the SCR-based protection structures, the teachings herein are applicable to a wide variety of high-speed interfaces. In FIG. 1B, half of a differential receive circuit is shown, with the RF signal pad 21 receiving a non-inverted RF signal component (VinP) of a differential RF signal. The IC 50 can further include another half of the differential receive circuit associated with an inverted RF signal component (VinN). In FIG. 1B, the capacitor 37 stores a common-mode voltage of the RF signal components (VinP/VinN).

As shown in FIG. 1B, the SCR-based overvoltage protection circuit 2 is connected between the RF signal pad 21 and ground. Thus, the SCR-based overvoltage protection circuit 2 is ground-referenced. Additionally, the input resistor 23 is connected between the RF signal pad 21 and an input node. Furthermore, the first NFET 31 includes a source connected to the input node, a drain connected to the RF receive circuit 35, and a gate controlled by the first driver 41. Additionally, the first PFET 32 includes a source connected to the input node, a drain connected to the RF receive circuit 35, and a gate controlled by the second driver 42. Furthermore, the second NFET 33 includes a source connected to the input node, a drain connected to the capacitor 37, and a gate controlled by the third driver 43. Additionally, the second PFET 34 includes a source connected to the input node, a drain connected to the capacitor 37, and a gate controlled by the fourth driver 44.

In the illustrated embodiment, the bodies of the first NFET 31 and the second NFET 32 are connected to ground thru the PW biasing circuit 45. Additionally, the bodies of the first PFET 33 and the second PFET 34 are connected to the supply voltage thru the NW biasing circuit 46.

Thus, rather than connected the bodies of the NFETs directly to ground and the bodes of the PFETs directly to the supply voltage, an indirect connection thru a bias circuit is used. The NW biasing circuit 45 and the PW biasing circuit 46 can correspond to resistors, diodes, switches, and/or other structures that provide impedance. By implementing the IC 50 in this manner, an indirect path from the RF signal pad 21 to the power supply during an overvoltage event is blocked. Accordingly, ground-referencing is improved.

Figure 1C:
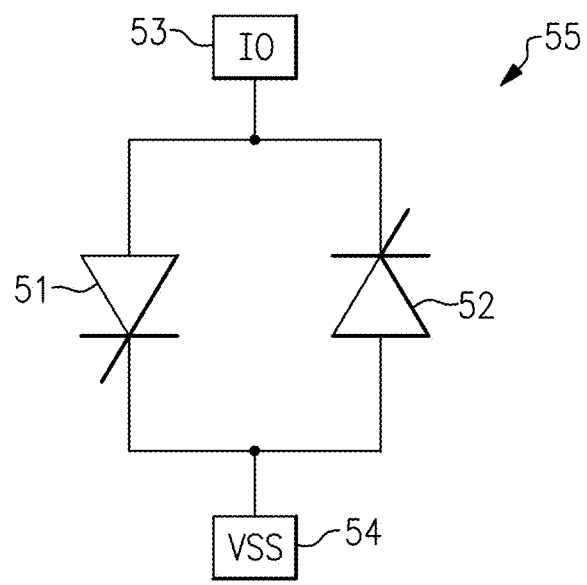
FIG. 1C is a schematic diagram of an SCR-based overvoltage protection circuit according to one embodiment.

FIG. 1C is a schematic diagram of an SCR-based overvoltage protection circuit 55 according to one embodiment. The SCR-based overvoltage protection circuit 55 includes a first SCR 51 having an anode connected to a signal pad 53 and a cathode connected to a ground (VSS) pad 54. Furthermore, the SCR-based overvoltage protection circuit 55 includes a second SCR 52 includes an anode connected to the ground pad 54 and a cathode connected to the signal pad 53. The signal pad 53 can be an input and/or output (IO) signal pad for receiving and/or transmitting RF signals.

In the illustrated embodiment, two SCRs are included in a parallel configuration, with one SCR 51 connected to provide forward overvoltage protection and another SCR 52 connected to provide reverse overvoltage protection. By connecting the SCRs in this manner, electrical overvoltage protection can be provided both for positive overstress events that increase the voltage of the signal pad 53 relative to the ground pad 54 and for negative overstress events that increase the voltage of the ground pad 54 relative to the signal pad 53.

Figure 1D:
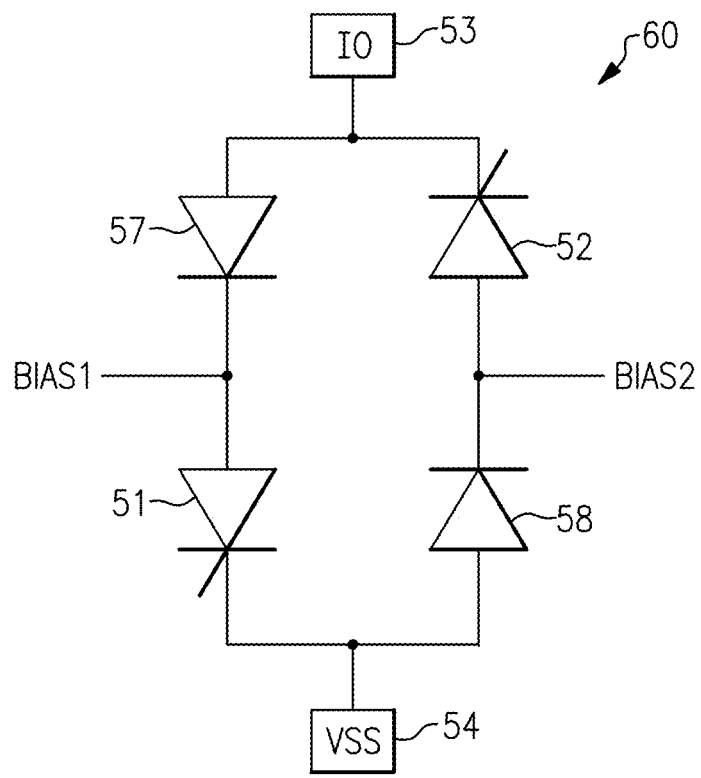
FIG. 1D is a schematic diagram of an SCR-based overvoltage protection circuit according to another embodiment.

FIG. 1D is a schematic diagram of an SCR-based overvoltage protection circuit 60 according to another embodiment. The SCR-based overvoltage protection circuit 60 includes a first SCR 51, a second SCR 52, a first diode 57, and a second diode 58.

As shown in FIG. 1D, an anode of the first diode 57 is connected to the signal pad 53 and a cathode of the first diode 57 is connected to an anode of the first SCR 51 at a node biased by a first bias signal BIAS1. Furthermore, a cathode of the first SCR 51 is connected to the ground pad 54. Additionally, an anode of the second diode 58 is connected to the ground pad 54 and a cathode of the second diode 58 is connected to an anode of the second SCR 52 at a node biased by a second bias signal BIAS2, which can be of the same or different electrical potential as the first bias signal BIAS1. Furthermore, a cathode of the second SCR 52 is connected to the signal pad 53.

The SCR-based overvoltage protection circuit 60 of FIG. 1D is similar to the SCR-based overvoltage protection circuit 55 of FIG. 1C, except that the SCR-based overvoltage protection circuit 60 further includes the first diode 57 in series with the first SCR 51 and the second diode 58 in series with the second SCR 52. Additionally, the intermediate node between each SCR and diode is biased by a bias voltage to aid in achieving low capacitance characteristics.

Any of the SCRs herein can be included in series with one or more diodes and/or other circuit components to aid in achieving desired forward and/or reverse protection characteristics. For example, including a diode in series with an SCR as shown in the example of FIG. 1D can increase an effective trigger voltage of the SCR-based overvoltage protection circuit.

Figure 2:
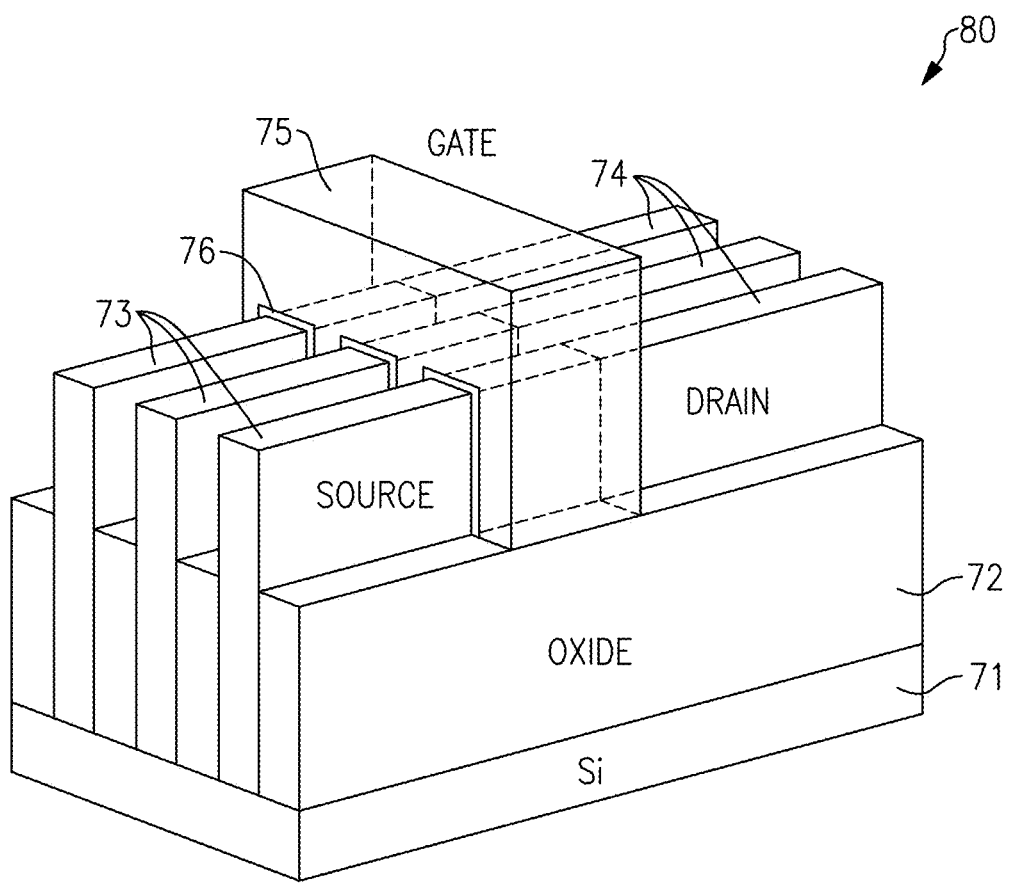
FIG. 2 is a perspective view of a fin field-effect transistor (FinFET) according to one embodiment.

FIG. 2 is a perspective view of a fin field-effect transistor (FinFET) 80 according to one embodiment. The FinFET 80 is fabricated on a silicon (Si) substrate 71, which can be doped (for example, using a p-type dopant). The FinFET 80 includes oxide regions 72 in which active fin regions have been formed. The active fin regions include source fin regions 73 and drain fin regions 74, which can be doped n-type and/or p-type as desired for a particular application. Additionally, a gate oxide region 76 and a polysilicon gate fin 75 have been formed over a portion of the active fin regions to form the FinFET 80.

The FinFET 80 can provide a number of advantages relative to other transistor technologies. For example, the FinFET 80 facilitates higher level of integration and technology scaling. Moreover, the FinFET 80 can provide higher electrical control over a channel, more effective leakage suppression, enhanced driving current, and/or higher intrinsic gain for superior analog performance.

Thus, the FinFET 80 provides a number of advantages suitable for deployment in ICs for high-speed data conversion, wide bandwidth wireless communications, and/or other high-performance applications. For instance, a semiconductor chip implemented with FinFETs can be used to enable the high-speed applications discussed above with reference to FIGS. 1A-1B.

Accordingly, to aid in meeting bandwidth constraints for 5G or other high performance applications, it is desirable use FinFET technology to fabricate semiconductor dies (also referred to herein as integrated circuits or ICs) for high-performance transceivers and/or high-speed interfaces.

Although FinFET technology can provide a number of advantages, such FinFETs can operate with higher parasitic resistance, higher parasitic capacitance, and/or poorer thermal characteristics (for instance, higher thermal impedance and/or more self-heating) relative to transistors fabricated using a conventional complementary metal oxide semiconductor (CMOS) process. Such characteristics can render FinFETs susceptible to damage from electrical overstress.

The teachings herein can be used to provide electrical overvoltage protection for ICs fabricated using FinFET technologies, thereby helping to meet tight design windows for robustness. For example, in certain embodiments herein, high voltage tolerant FinFET SCRs are provided for handling high stress current and high RF power handling capability, while providing low capacitance to allow wide bandwidth operation.

Figure 3A:
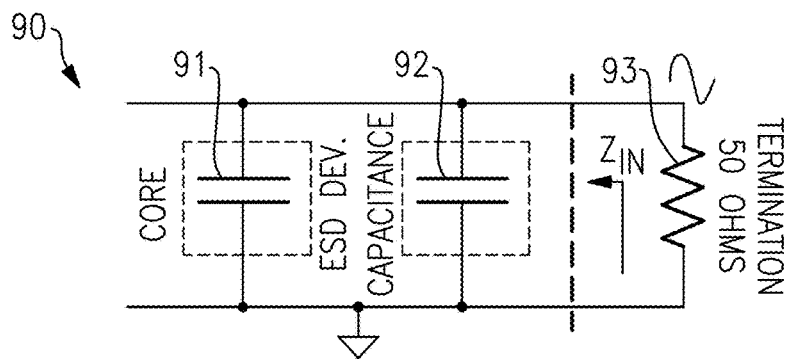
FIG. 3A is one embodiment of a capacitance model for an SCR-based overvoltage protection circuit.

FIG. 3A is one embodiment of a capacitance model 90 for an SCR-based overvoltage protection circuit. The capacitance model 90 includes a parallel combination of a core capacitance 91, an ESD device capacitance 92, and a 50 Ohm termination impedance 93. The capacitance model 90 represents loading presented to an RF signal received on an RF signal pad. Additionally, the parallel combination of the core capacitance 91 and the ESD device capacitance 92 represent an input impedance $Z_{IN}$.

The performance of RF circuits is degraded by capacitive loading and/or non-linearity arising from the presence of electrical overvoltage protection structures along RF signal paths. Thus, it is desirable for an electrical overstress protection structure to have capacitance that is both low and linear with respect to voltage.

Figure 3B:
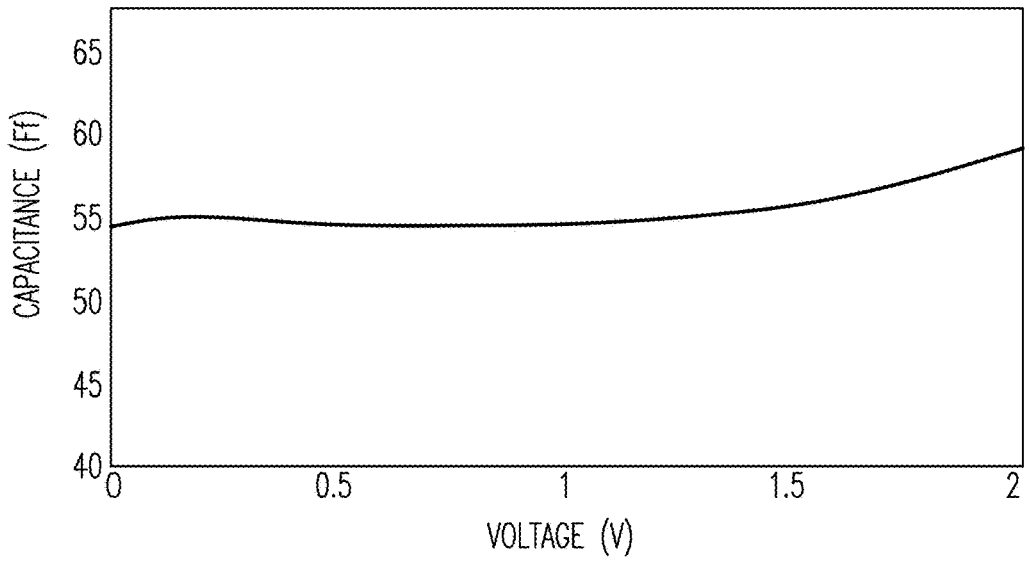
FIG. 3B is a graph of one example of capacitance versus voltage for an SCR-based overvoltage protection circuit.

FIG. 3B is a graph of one example of capacitance versus voltage for an SCR-based overvoltage protection circuit. In this example, the capacitance is both low (less than 60 fF) and linear (less than 5 fF/V in variation) over a voltage range of 0V to 2V.

Figure 3C:
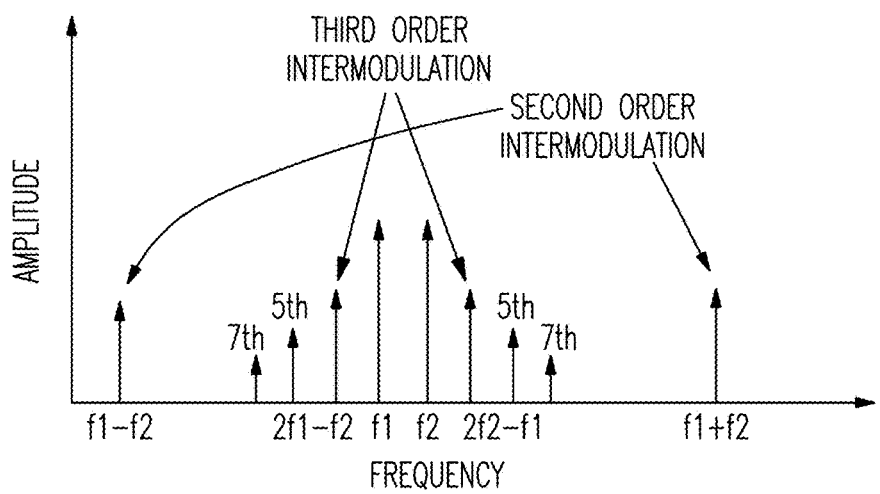
FIG. 3C is a graph of one example of amplitude versus frequency for an SCR-based overvoltage protection circuit undergoing two tone testing.

FIG. 3C is a graph of one example of amplitude versus frequency for an SCR-based overvoltage protection circuit undergoing two tone testing. As shown in FIG. 3C, two tone testing using a first frequency f1 and a second frequency f2 can result in tones appears due to both second order intermodulation and third order intermodulation. The magnitude of second order and third order intermodulation components is exacerbated by the capacitance of electrical overvoltage protection structures along RF signal paths. Thus, it is desirable for the capacitance of an electrical overvoltage protection structure to be both low and linear.

Figure 4A:
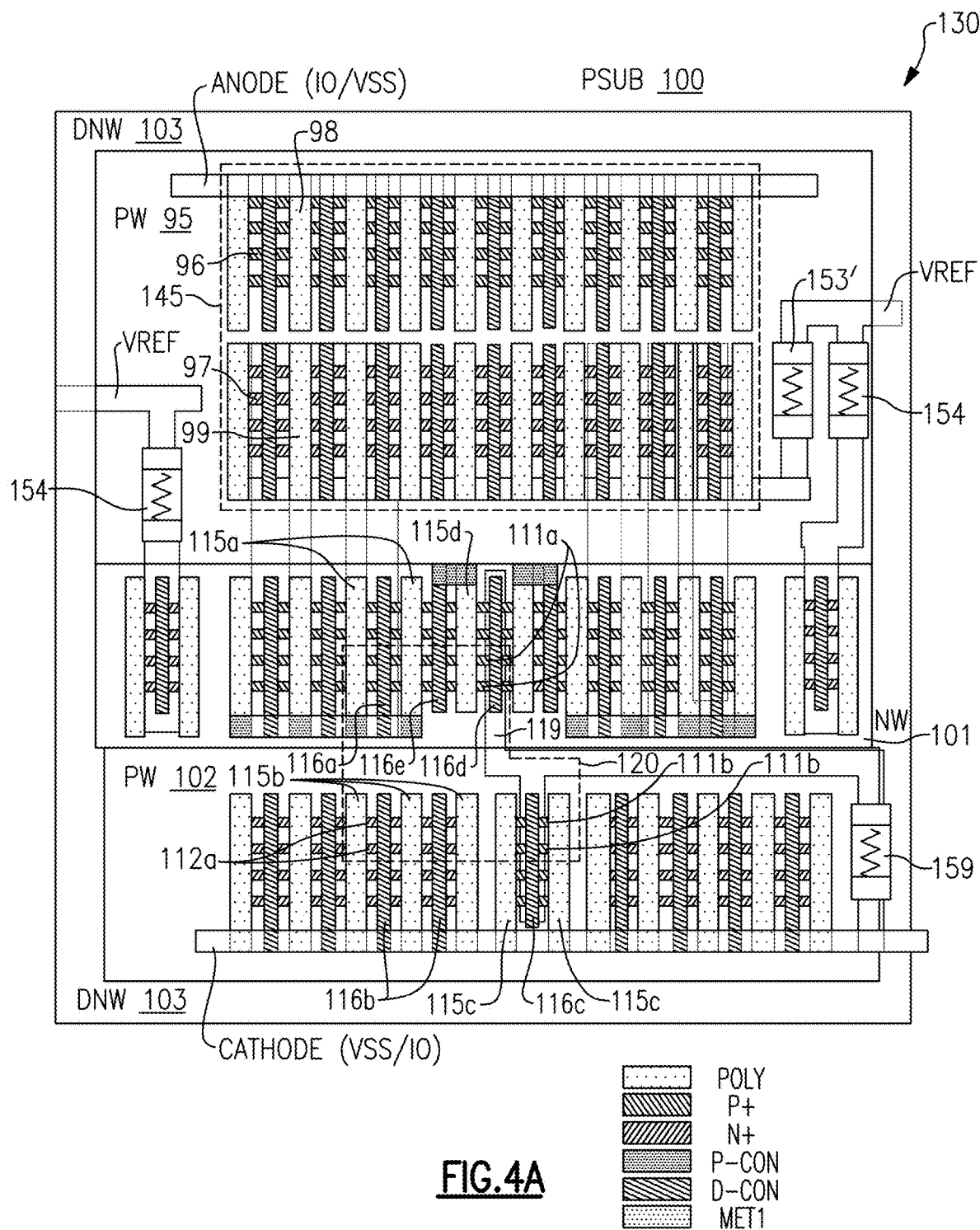
FIG. 4A is a plan view of a FinFET SCR-based protection structure according to one embodiment.
Figure 4B:
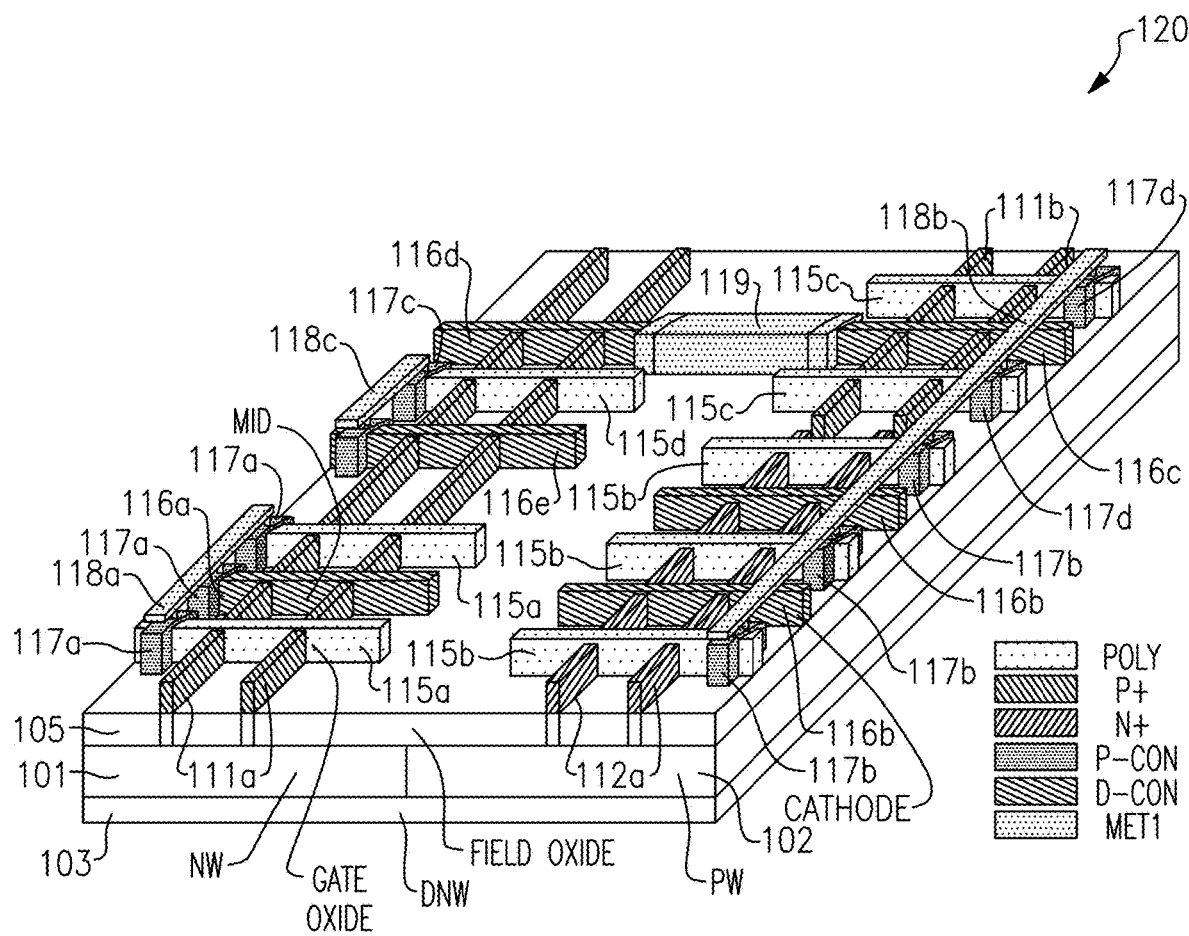
FIG. 4B is a perspective view of an SCR section of the FinFET SCR-based protection structure of FIG. 4A.

FIG. 4A is a plan view of a FinFET SCR-based protection structure 130 according to one embodiment. FIG. 4B is a perspective view of an SCR section 120 of the FinFET SCR-based protection structure 130 of FIG. 4A.

With reference to FIGS. 4A and 4B, the FinFET SCR-based protection structure 130 illustrates one embodiment of a chip layout used to implement an SCR protection structure in accordance with the teachings herein. However, the SCR protection structures disclosed herein can be implemented in other ways. One or more instantiations of the FinFET SCR-based protection structure 120 can be included on a semiconductor die to protect circuitry of the die's interface from damage arising from electrical overstress events, such as ESD events.

For example, a first instantiation of the FinFET SCR-based protection structure 130 can have an anode connected to an IO pad and a cathode connected to a VSS pad, and a second instantiation of the FinFET SCR-based protection structure 130 can have an anode connected to the VSS pad and a cathode connected to the IO pad. Connecting a pair of FinFET SCR-based protection structures in this manner provides forward and reverse protection in accordance with the embodiment of FIG. 1D discussed above. When including two SCR-based protection structures 130, the structures 130 can be implemented as separate devices with independent semiconductor tubs, or as an embedded structure with an extra junction and bias terminal built-in.

The SCR protection structures herein can include various wells (for instance, n-type well (NW) and/or p-type well (PW) regions), various active regions (for instance, n-type active (N+) and/or p-type active (P+) regions), gates, and/or other structures. As persons of ordinary skill in the art will appreciate, P+ regions have a higher doping concentration than the PWs. Additionally, N+ regions have a higher doping concentration than NWs. Persons having ordinary skill in the art will appreciate various concentrations of dopants in the regions.

It should be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in the figures of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorous, as a dopant.

With continuing reference to FIGS. 4A and 4B, the FinFET SCR-based protection structure 130 is fabricated in a p-type substrate (PSUB) 100. Additionally, a deep n-type well (DNW) 103 is formed in the PSUB 100. The DNW 103 serves to electrically isolate NW and PW regions from the PSUB 100.

The FinFET SCR-based protection structure 130 includes a diode section 145 formed in a PW 95. The diode section 145 includes P+ fin regions 96 formed in the PW 95 and connected by metallization to an anode terminal of the FinFET SCR-based protection structure 130. The diode section 145 also includes N+ fin regions 97 formed in the PW and connected by metallization to the SCR section 120. Gate regions 98 are formed over the P+ fin regions 96 and gate regions 99 are formed over the N+ fin regions 97.

The P+ fin regions 96 and PW 95 serve as an anode of the diode section 145, while the N+ fin regions 97 serve as a cathode of the diode section 145. Additionally, inclusion of the gate regions 98/99 enhance a surface conduction of the diode section 145 and achieve a more compact device area relative to a configuration in which trench oxide regions are used to separate diffusion. Not only does a more compact device area achieve a smaller footprint on an IC, but also reduces an amount of metallization and associated parasitics needed for interconnecting fingers of the device.

As shown in FIGS. 4A and 4B, the SCR section 120 includes an NW 101 and a PW 102 formed adjacent to one another in the DNW 103. Additionally, a first group of P+ fin regions 111a are formed over the NW 101. Additionally, a second group of P+ fin regions 111b are formed in parallel with the first group of P+ fin regions 111a but are of shorter length. Furthermore, a first group of N+ fin regions 112a are formed over the PW 102 and aligned with the second group of P+ fin regions 111b.

In this example, groups of fin regions each include two fins connected in parallel to extend the power handling capability of the structure relative to a configuration with one fin region. However, more or fewer fin regions can be included to achieve a desired current handling capability of the device.

With continuing reference to FIGS. 4A and 4B, the SCR section 120 further includes various polysilicon gate regions over the NW 101 and the PW 102. The polysilicon gate regions include a first group of polysilicon gate regions 115a formed over the first group of P+ fin regions 111a. Additionally, the SCR section 120 further includes a second group of polysilicon gate regions 115b formed over the first group of N+ fin regions 112a. Furthermore, the SCR section 120 further includes a third group of polysilicon gate regions 115c formed over the second group of P+ fin regions 111b. Additionally, the SCR section 120 further includes a fourth polysilicon gate region 115d formed over the first group of P+ fin regions 111a.

Absent manufacturing variation, the polysilicon gate regions are perpendicular to the active fin regions. Inclusion of the polysilicon gate regions improves the SCR's turn-on speed in response to fast overstress transients. For example, the polysilicon gate regions introduce surface breakdown to lower intrinsic avalanching voltage, thereby lowering trigger voltage.

With continuing reference to FIGS. 4A and 4B, various metallization including contact metallization (poly contact P-CON and diffusion contact D-CON) and metal one routes (M1) are depicted. The metallization is used in part to form connections that serve to connect various devices to one another as well as to provide terminals for the SCR section 120.

For example, as shown in FIG. 4B, the D-CON region 116a connects a portion of the P+ fin regions 111a to the M1 region 118a, which connects to the cathode of the diode section 145. Additionally, the P-CON regions 117a connect the first group of gate regions 115a and the D-CON region 116a to the M1 region 118a. This node corresponds to a mid node MID of the FinFET SCR-based protection structure 130.

The diode section 145 is connected between the anode terminal of the FinFET SCR-based protection structure 130 and the mid node MID, while the SCR section 120 is connected between the mid node MID and the cathode terminal of the FinFET SCR-based protection structure 130.

With continuing reference to FIGS. 4A and 4B, the P-CON regions 117b connect to the second group of gate regions 115b and are connected using an M1 region 118b used to control the gate potential. In certain implementations, the M1 region 118b is grounded. However, other implementations are possible.

The SCR section 120 includes an NPN bipolar transistor having an emitter, a base, and a collector corresponding to the N+ fin regions 112a, the PW 102, and the NW 101, respectively. Additionally, the SCR section 120 includes a PNP bipolar transistor having an emitter, a base, and a collector corresponding to the P+ fin regions 111a, the NW 101, and the PW 102, respectively.

The SCR section 120 can be fabricated in a variety of advanced technologies, including CMOS FinFET process nodes of 16 nm or less.

In certain implementations, a voltage of the NW 101 (corresponding to base voltage of the PNP) is left floating, which serves to reduce a trigger voltage of the SCR section 120. In contrast, conventional diode and SCR protection structures suffer from a large trigger voltage that leads to a large voltage build-up and corresponding damage to circuitry being protected.

The SCR section 120 includes a pair of gate-to-source connected triggering PFETs in series that serve to aid in triggering the SCR in response to an overvoltage condition. The gate of the first triggering PFET is formed by the gate regions 115a, with the gate-to-source connection provided by the M1 region 118a. Additionally, the gate of the second triggering PFET is formed by the gate region 115d, with the M1 region 118c. The SCR section 120 also includes a metal region 119 used to connect the D-CON region 116d to the D-CON region 116c, thereby providing a connection between the source of the second triggering PFET and the PW 102.

Thus, the pair of series gate-to-source connected triggering PFETs are connected from the MID node to the PW 102. Since the PW serves as the base of the SCR's NPN bipolar transistor, a mechanism for current injection and expedited turn-on of the SCR is provided.

Figure 4C:
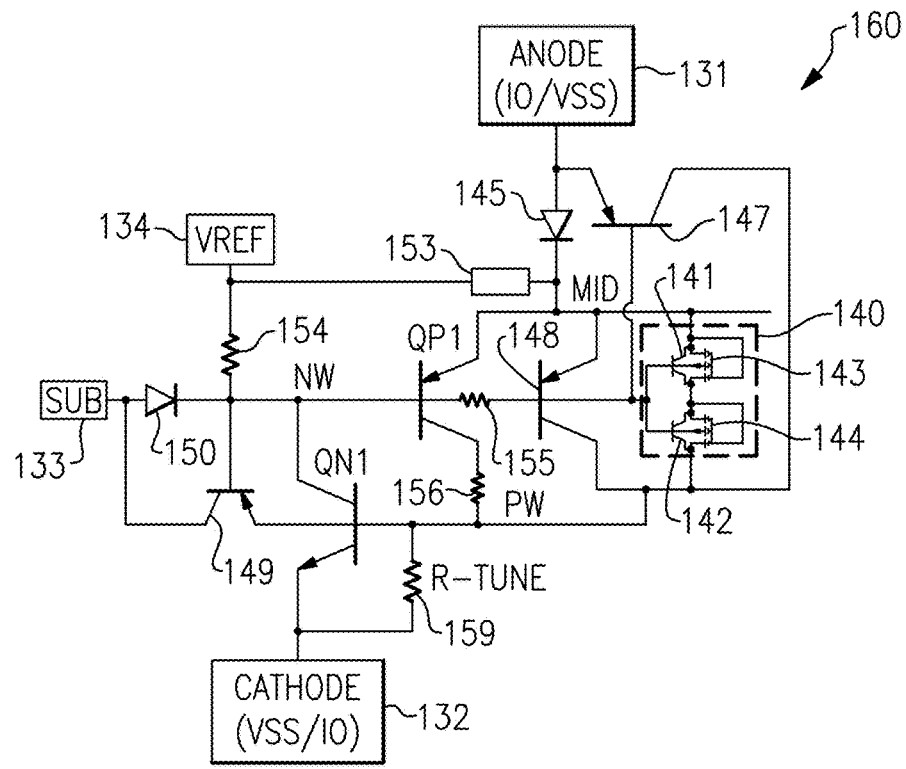
FIG. 4C is one embodiment of a circuit diagram for the FinFET SCR-based protection structure of FIGS. 4A-4B.

FIG. 4C is one embodiment of a circuit diagram 160 of the FinFET SCR-based protection structure 130 of FIGS. 4A-4B. The FinFET SCR-based protection circuit 160 includes an anode terminal 131, a cathode terminal 132, a substrate terminal 133, a reference voltage terminal 134, a trigger circuit 140, a diode 145, a first PNP bipolar transistor 147, a second PNP bipolar transistor 148, a third PNP bipolar transistor 149, a substrate diode 150, a linearity enhancement impedance 153, an NW bias resistor 154, a base resistor 155, a collector resistor 156, a tuning resistor 159, an SCR PNP bipolar transistor QP1, and an SCR NPN bipolar transistor QN1.

As shown in FIG. 4C, the diode 145 is connected between the anode terminal 131 and a mid node MID. Additionally, the SCR PNP bipolar transistor QP1 includes an emitter connected to the mid node MID, a base connected to an NW node, and a collector connected to a PW node through the collector resistor 156. Furthermore, the SCR NPN bipolar transistor QN1 includes an emitter connected to the cathode terminal 132, a base connected to the PW node, and a collector connected to the NW node.

In the illustrated embodiment, the trigger circuit 140 is connected between the mid node MID and the base of the SCR NPN bipolar transistor QN1 (which corresponds to the PW node). The trigger circuit 140 serves to reduce the trigger voltage of the SCR by providing a displacement current to the base of the SCR NPN bipolar transistor QN1 in response to an electrical overstress event. The trigger circuit 140 also serves to reduce DC leakage current of the SCR by biasing the base of the SCR NPN bipolar transistor QN1.

In the illustrated embodiment, the trigger circuit 140 includes a first PNP trigger bipolar transistor 141, a second PNP trigger bipolar transistor 142, a first FinFET trigger PFET 143, and a second FinFET trigger PFET 144. The first FinFET trigger PFET 143 and the second FinFET trigger PFET 144 are connected in series between the mid node MID and base of the SCR NPN bipolar transistor QN1. For example, the source and gate of the first FinFET trigger PFET 143 are connected to the mid node MID, while the drain of the first FinFET trigger PFET 143 is connected to a source and gate of the second FinFET trigger PFET 144. Additionally, the drain of the second FinFET trigger PFET 144 is connected to the base of the SCR NPN bipolar transistor QN1.

As shown in FIG. 4C, the first PNP trigger bipolar transistor 141 includes an emitter and a collector connected to the source and drain of the first FinFET trigger PFET 143, respectively. Additionally, the second PNP trigger bipolar transistor 142 includes an emitter and a collector connected to the source and drain of the second FinFET trigger PFET 144, respectively. The bases of the first PNP trigger bipolar transistor 141 and the second PNP trigger bipolar transistor 144 are connected to the NW node through the base resistor 155.

The tuning resistor 159 (of a resistance R-TUNE) is also included between the base of the SCR NPN bipolar transistor QN1 and the cathode terminal 132 to provide fine-tuned control over turn-on characteristics of the SCR. The tuning resistor 159 receives the displacement current from the trigger circuit 140, and thus operates in combination with the trigger circuit 140 to aid in activating the SCR in response to an electrical overstress event.

The linearity enhancement impedance 153 improves linearity performance by blocking a potential path between the anode terminal 131 (through the diode 145) and the reference voltage terminal 134 for RF signals. Furthermore, including the linearity enhancement impedance 153 allows biasing of the mid node MID to a desired electrical potential to achieve low capacitance. The linearity enhancement impedance 153 can correspond to resistors, diodes, switches, and/or other structures that provide impedance.

The NW bias resistor 154 is connected between the reference voltage terminal 134 and the NW node. In combination, the NW bias resistor 154 and the linearity enhancement impedance 153 serve to bias a base-to-emitter junction of the SCR PNP bipolar transistor QP1 to achieve low capacitance. In certain implementations, the reference voltage terminal 134 corresponds to a supply voltage (VDD) terminal. However, other implementations are possible.

With continuing reference to FIG. 4C, the first PNP bipolar transistor 147 includes an emitter electrically connected to the anode terminal 131, a base connected to the NW node through the base resistor 155, and a collector connected to the PW node. Additionally, the second PNP bipolar transistor 148 includes an emitter electrically connected to the mid node MID, a base electrically connected to the NW node through the base resistor 155, and a collector connected to the PW node. Furthermore, the third PNP bipolar transistor 149 includes an emitter connected to the PW node, a base connected to the NW node, and a collector connected to the substrate terminal 133. Additionally, the substrate diode 150 includes an anode connected to the substrate terminal 133 and a cathode connected to the NW node.

Figure 4D:
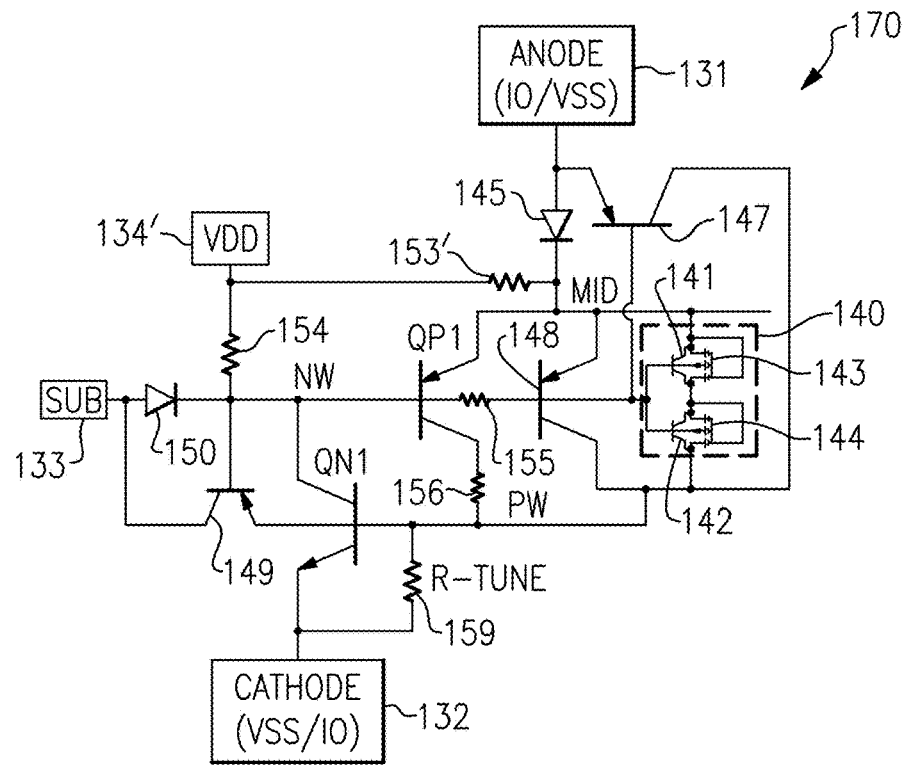
FIG. 4D is another embodiment of a circuit diagram for the FinFET SCR-based protection structure of FIGS. 4A-4B.

FIG. 4D is another embodiment of a circuit diagram 170 for the FinFET SCR-based protection structure of FIGS. 4A-4B. The FinFET SCR-based protection circuit 170 of FIG. 4D is similar to the FinFET SCR-based protection circuit 160 of FIG. 4C, except the FinFET SCR-based protection circuit 170 depicts a specific configuration of a linearity enhancement impedance in which a linearity enhancement resistor 153' is connected between a power supply voltage terminal 134' (VDD) and the mid node MID.

Figure 5:
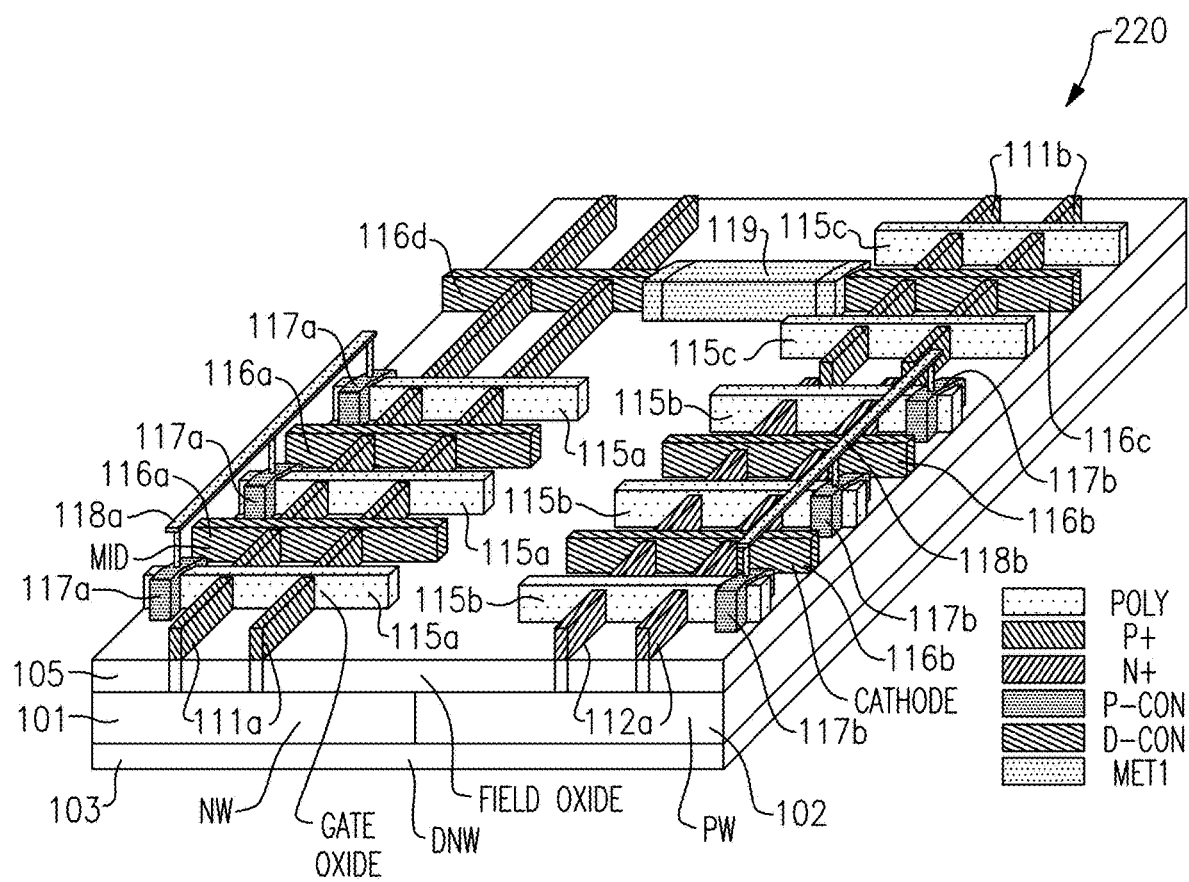
FIG. 5 is a perspective view of an SCR section of a FinFET SCR-based protection structure according to another embodiment.

FIG. 5 is a perspective view of an SCR section 220 of a FinFET SCR according to another embodiment.

The SCR section 220 an NW 101 and a PW 102 formed adjacent to one another in a DNW 103. Additionally, a first group of P+ fin regions 111a are formed over the NW 101, while a second group of P+ fin regions 111b and a first group of N+ fin regions 112a are formed over the PW 102. Additionally, a first group of polysilicon gate regions 115a are formed over the first group of P+ fin regions 111a, a second group of polysilicon gate regions 115b are formed over the first group of N+ fin regions 115b, and a third group of polysilicon gate regions 115c are formed over the second group of P+ fin regions 111b.

With continuing reference to FIG. 5, D-CON regions 116a connect to the first group of P+ fin regions 111a to form a mid node MID. Additionally, P-CON regions 117a connect to the gate regions 115a and to the M1 region 118a to prove a mechanism for controlling the gate potential of the gates over the NW 103. Furthermore, P-CON regions 117b connect to the gate regions 115b and the M1 region 118b to prove a mechanism for controlling the gate potential of the gates over the PW 102. Additionally, the metal region 119 connects the D-CON region 116d to the D-CON region 116c to provide a path in metal for a trigger current to flow.

Segmenting the SCR as depicted in FIG. 5 leads to low capacitance and a compact layout.

The SCR section 220 is suitable for FinFET processes that use a dual epitaxial layer (EPI) for growing N+ and P+ fins. For example, the SCR section 220 can be implemented for processes in which separate oxide diffusion (OD) layers are used for defining N+ and P+ diffusion.

Figure 6A:
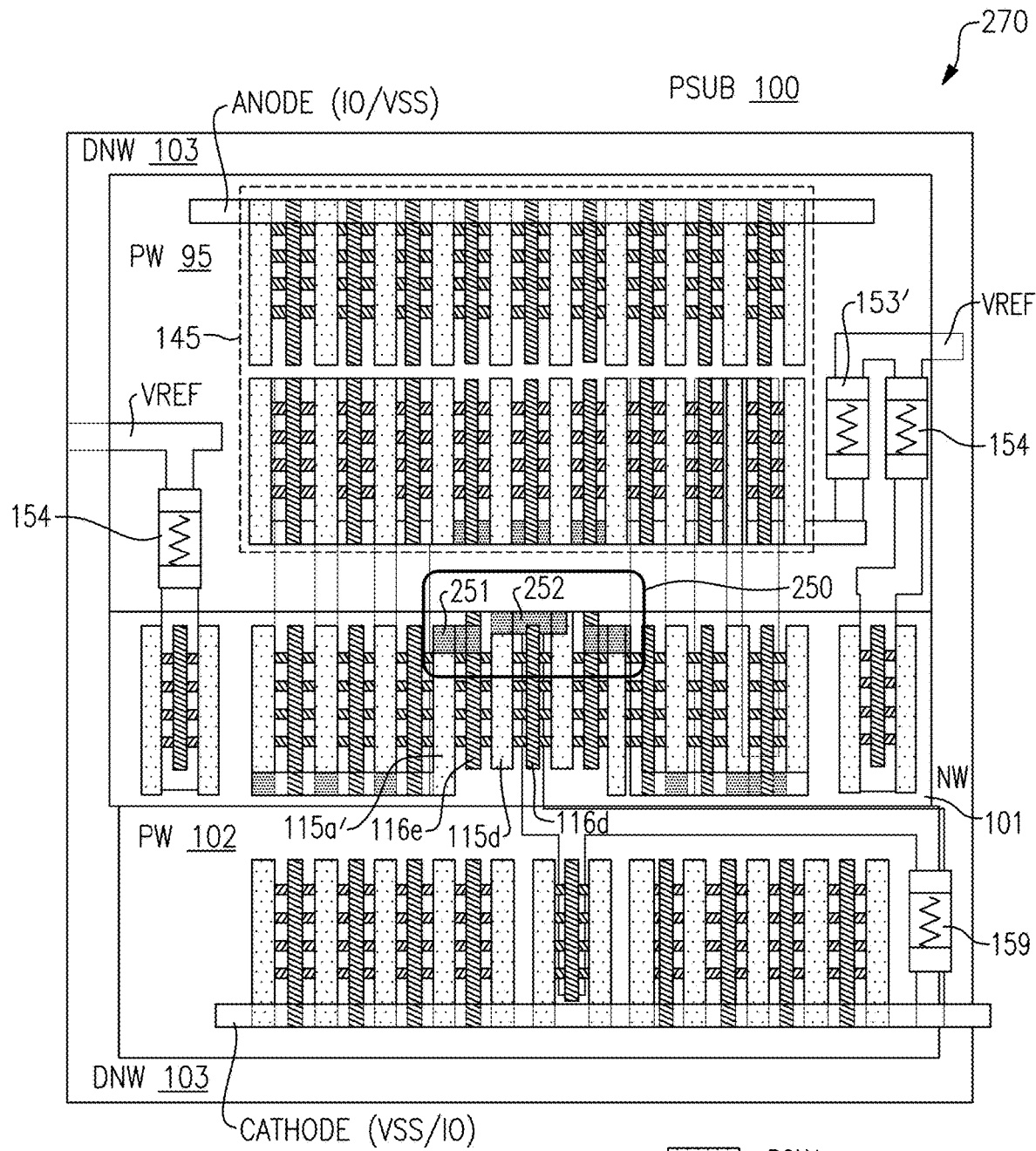
FIG. 6A is a plan view of a FinFET SCR-based protection structure according to another embodiment.
Figure 6B:
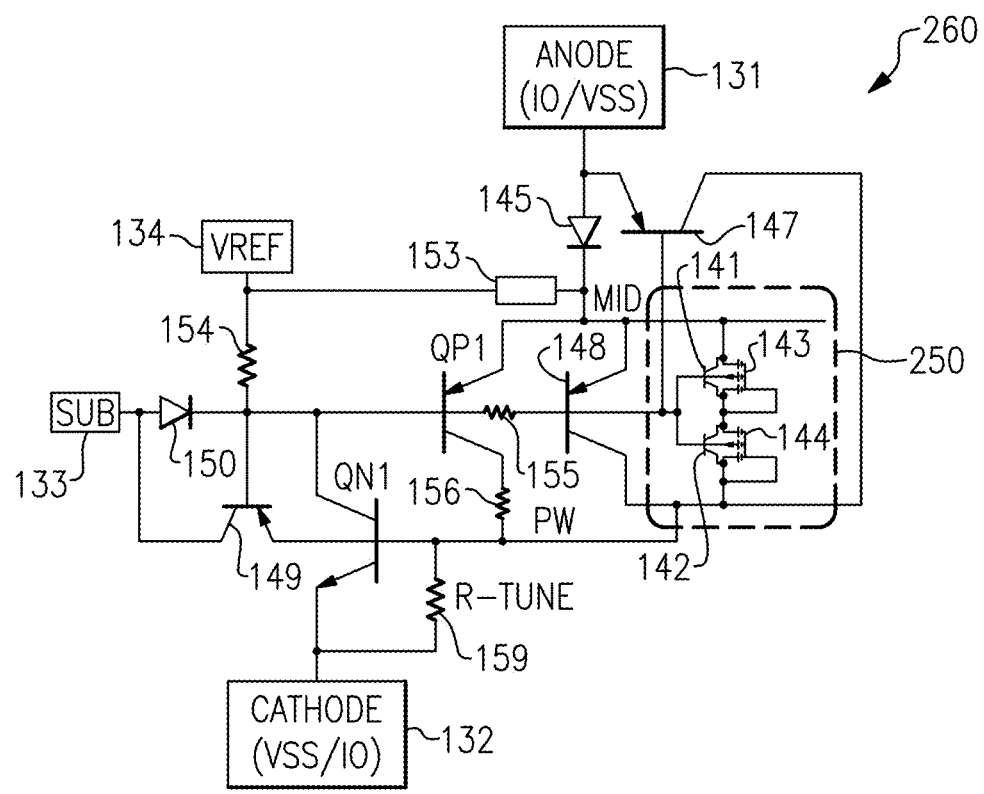
FIG. 6B is one embodiment of a circuit diagram for the FinFET SCR-based protection structure of FIG. 6A.

FIG. 6A is a plan view of a FinFET SCR 270 according to another embodiment. FIG. 6B is one embodiment of a circuit diagram 260 for the FinFET SCR 270 of FIG. 6A.

The FinFET SCR-based protection circuit 260 of FIG. 6B is similar to the FinFET SCR-based protection circuit 160 of FIG. 4C, except the FinFET SCR-based protection circuit 260 depicts a different implementation of a trigger circuit 250 in which the FinFET trigger PFETs are connected from drain to gate rather than from source to gate.

For example, as shown in FIG. 6B, the trigger circuit 260 includes a first PNP trigger bipolar transistor 141, a second PNP trigger bipolar transistor 142, a first FinFET trigger PFET 143, and a second FinFET trigger PFET 144. The first FinFET trigger PFET 143 and the second FinFET trigger PFET 144 are connected in series between the mid node MID and base of the SCR NPN bipolar transistor QN1. For example, the source of the first FinFET trigger PFET 143 is connected to the mid node MID, while the drain and gate of the first FinFET trigger PFET 143 is connected to a source of the second FinFET trigger PFET 144. Additionally, the drain and gate of the second FinFET trigger PFET 144 are connected to the base of the SCR NPN bipolar transistor QN1.

By connecting the FinFET trigger PFETs 143/144 with a drain-to-gate connection, a lower trigger voltage is achieved relative to a configuration in which the FinFET trigger PFETs have a source-to-gate connection. Thus, the embodiments of FIGS. 6A and 6B are suitable for applications with very low trigger voltage.

As shown in FIG. 6A, the drain-to-gate connections are made by metal regions 251 and 252. For example, the metal region 251 connects the gate region 115a' (corresponding to the gate of the first FinFET trigger PFET 143) to D-CON region 116e (corresponding to the drain of the first FinFET trigger PFET 143), while the metal region 252 connects the gate region 115d (corresponding to the gate of the second FinFET trigger PFET 144) to D-CON region 116d (corresponding to the drain of the second FinFET trigger PFET 144).

Applications

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. An integrated circuit (IC) comprising:
a radio frequency (RF) signal pad and a ground pad; and
an overvoltage protection circuit connected between the RF signal pad and the ground pad and configured to activate in response to an electrical overvoltage condition received between the RF signal pad and the ground pad, wherein the overvoltage protection circuit comprises:
a first fin field-effect transistor (FinFET) silicon controlled rectifier (SCR) including a first PNP bipolar transistor and a first NPN bipolar transistor, wherein a collector of first NPN bipolar transistor is connected to a base of the first PNP bipolar transistor, and a base of the first NPN bipolar transistor is connected to a collector of the first PNP bipolar transistor;
a fin field-effect transistor (FinFET) trigger circuit connected between an emitter of the first PNP bipolar transistor and the base of the first NPN bipolar transistor; and
a linearity enhancement impedance connected between a reference voltage terminal and the emitter of the first PNP bipolar transistor, the linearity enhancement impedance configured to inhibit coupling of a RF signal from the RF signal pad to the reference voltage terminal.

2. The IC of claim 1, wherein the FinFET trigger circuit includes a first FinFET transistor and a second FinFET transistor in series.

3. The IC of claim 2, wherein a gate of the first FinFET transistor is connected to a source of the first FinFET transistor and to the emitter of the first PNP bipolar transistor, and wherein a gate of the second FinFET transistor is connected to a source of the second FinFET transistor and to a drain of the first FinFET transistor.

4. The IC of claim 2, wherein a gate of the first FinFET transistor is connected to a drain of the first FinFET transistor and to a source of the second FinFET transistor, and wherein a gate of the second FinFET transistor is connected to a drain of the second FinFET transistor and to the base of the first NPN bipolar transistor.

5. The IC of claim 1, further comprising an n-type field-effect transistor (NFET) and a p-type field-effect transistor (PFET) each having a source configured to receive the RF signal, the IC further comprising at least one of an n-well biasing circuit for biasing a body of the PFET or a p-well biasing circuit for biasing a body of the NFET.

6. The IC of claim 1, wherein the overvoltage protection circuit further comprises a FinFET diode having a cathode connected to the emitter of the PNP bipolar transistor.

7. The IC of claim 6, wherein an anode of the FinFET diode is connected to the RF signal pad, and an emitter of the NPN bipolar transistor is connected to the ground pad.

8. The IC of claim 7, wherein the overvoltage protection circuit further comprises a second FinFET diode having an anode connected to the ground pad, a second FinFET SCR having an anode connected to a cathode of the second FinFET diode and a cathode connected to the RF signal pad.

9. The IC of claim 1, wherein the linearity enhancement impedance includes a resistor connected between the reference voltage terminal and the emitter of the PNP bipolar transistor.

10. The IC of claim 1, wherein the overvoltage protection circuit further includes a bias resistor connected between the reference voltage terminal and the base of the PNP bipolar transistor.

11. The IC of claim 1, wherein the reference voltage terminal is a supply voltage terminal.

12. The IC of claim 1, further comprising:
an n-type well (NW) forming the base of the PNP bipolar transistor and the collector of the NPN bipolar transistor;
a p-type well (PW) formed adjacent to the NW and forming the base of the NPN bipolar transistor and the collector of the PNP bipolar transistor;
a plurality of p-type active (P+) fin regions over the NW and forming the emitter of the PNP bipolar transistor; and
a plurality of n-type active (N+) fin regions over the PW and forming the emitter of the NPN bipolar transistor.

13. The IC of claim 12, further comprising a first plurality of polysilicon gate regions formed over the NW and the plurality of P+ fin regions, and a second plurality of polysilicon gate regions formed over the PW and the plurality of N+ fin regions.

14. The IC of claim 13, wherein the FinFET trigger circuit is formed in the NW, wherein the overvoltage protection circuit includes a metal conductor configured to carry a trigger current from the FinFET trigger circuit to the PW.

15. The IC of claim 13, wherein the plurality of P+ fin regions, the plurality of N+ fin regions, the first plurality of polysilicon regions, and the second plurality of polysilicon regions form a plurality of FinFET SCR segments that are interconnected to one another by metallization.

16. The IC of claim 1, further comprising a tuning resistor connected between the base of the NPN bipolar transistor and an emitter of the NPN bipolar transistor.

17. An overvoltage protection circuit for protecting a radio frequency (RF) signal pad and a ground pad of an integrated circuit (IC), wherein the overvoltage protection circuit comprises:

a first fin field-effect transistor (FinFET) silicon controlled rectifier (SCR) including a first PNP bipolar transistor and a first NPN bipolar transistor, wherein a collector of first NPN bipolar transistor is connected to a base of the first PNP bipolar transistor, and a base of the first NPN bipolar transistor is connected to a collector of the first PNP bipolar transistor;

a fin field-effect transistor (FinFET) trigger circuit connected between an emitter of the first PNP bipolar transistor and the base of the first NPN bipolar transistor; and a linearity enhancement impedance connected between a reference voltage terminal and the emitter of the first PNP bipolar transistor, the linearity enhancement impedance configured to inhibit coupling of a RF signal from the RF signal pad to the reference voltage terminal.

18. The overvoltage protection circuit of claim 17, wherein the overvoltage protection circuit further comprises a FinFET diode having a cathode connected to the emitter of the PNP bipolar transistor.

19. The overvoltage protection circuit of claim 18, wherein an anode of the FinFET diode is connected to the RF signal pad, and an emitter of the NPN bipolar transistor is connected to the ground pad.

20. A method of protecting an integrated circuit (IC) from electrical overstress, the method comprising:

receiving an electrical overvoltage condition between a radio frequency (RF) signal pad and a ground pad;

conducting a trigger current in response to the electrical overvoltage condition using a fin field-effect transistor (FinFET) trigger circuit that is connected between an emitter of a first PNP bipolar transistor and a base of a first NPN bipolar transistor;

activating the FinFET SCR in response to the trigger current, wherein the FinFET SCR includes the first PNP bipolar transistor and the first NPN bipolar transistor, wherein a collector of first NPN bipolar transistor is connected to a base of the first PNP bipolar transistor, and a base of the first NPN bipolar transistor is connected to a collector of the first PNP bipolar transistor; and inhibiting coupling of a RF signal from the RF signal pad using a linearity enhancement impedance connected between a reference voltage terminal and the emitter of the first PNP bipolar transistor.

\* \* \* \* \*